United States Patent [19]

Murayama

[11] Patent Number: 5,853,817
[45] Date of Patent: Dec. 29, 1998

[54] METHOD FOR PRODUCING A THIN FILM RESIN MATRIX

[75] Inventor: Yoichi Murayama, Tokyo, Japan

[73] Assignees: C. Itoh Fine Chemical Co., Ltd.; Yoichi Murayama, both of Japan

[21] Appl. No.: 974,998

[22] Filed: Nov. 20, 1997

Related U.S. Application Data

[63] Continuation of Ser. No. 581,370, Dec. 29, 1995, abandoned.

[30] Foreign Application Priority Data

Sep. 18, 1995 [JP] Japan .................................. 7-238861

[51] Int. Cl.$^6$ ........................................................ C08F 2/46
[52] U.S. Cl. .......................... 427/488; 427/58; 427/108; 427/124; 427/250; 427/255.2; 427/256.6; 427/295; 427/404; 427/407.1; 427/509; 427/569; 427/576; 427/577; 427/585

[58] Field of Search .................................. 427/488, 576, 427/577, 585, 404, 407.1, 569, 250, 294, 255.2, 295, 256.6, 58, 108, 124, 509

[56] References Cited

U.S. PATENT DOCUMENTS 5,295,220  3/1994  Heming et al. ........................ 427/569

Primary Examiner—Bernard Pinalto
Attorney, Agent, or Firm—Wenderoth, Lind & Ponack

[57] ABSTRACT

The present invention provides a method for producing a a high-performance black matrix taking the palce of a Cr film black matrix and a high-performance color display thin film, which is comprises steps of vaporizing one or more organic pigments or vaporizing and exciting a metal or an alloy together with said organic pigments, and forming a thin film or a mixed composite thin film onto a substrate by the plasma exciting deposition.

14 Claims, 4 Drawing Sheets

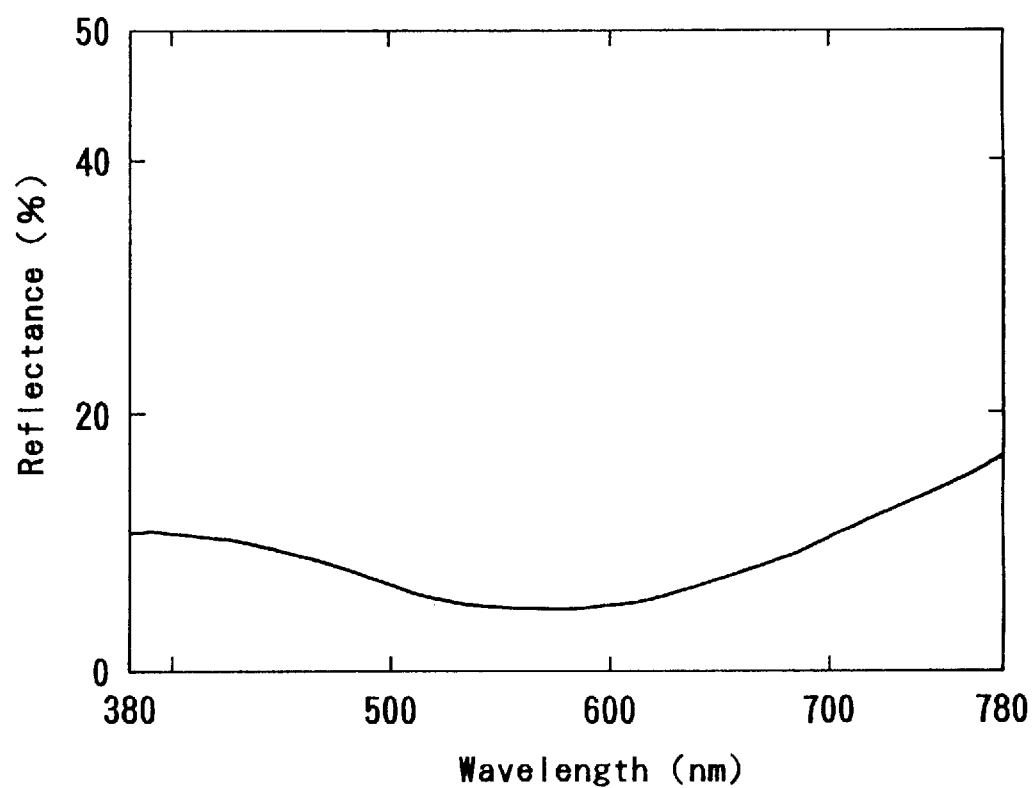
F I G. 3

METHOD FOR PRODUCING A THIN FILM RESIN MATRIX

This application is a continuation of now abandoned application, Ser. No. 08/581,370, filed Dec. 29, 1995.

FIELD OF THE INVENTION

The present invention relates to a method for producing a thin film resin matrix. More particularly, the present invention relates to a novel method for producing a thin film resin matrix which is appropriately applicable for a black matrix of liquid crystal color display such as TFT and STN and various color displays and realizes to easy form a high-quality film.

PRIOR ART AND PROBLEMS

In a liquid crystal color display such as TFT or STN, color filters covering three colors including red (R), green (G) and blue (B) are provided on a transparent electrode substrate such as glass, and color display is accomplished by controlling the luminous energy of light transmitting these color filters through adjustment of voltage applied to said transparent electrode substrate. Actually, however, color display based solely on the three color filters has some defects in definition, for example. With a view to improving the color forming effect and contrast, therefore, a film known as black matrix having shading ability is formed between individual color filters R, G and B on the transparent electrode substrate.

A color filter for TFT based on the conventional pigment dispersion process typically comprises three color filters consisting of a red color filter, a green color filter and a blue color filter, provided on a glass substrate serving as a transparent electrode substrate, and Cr-film black matrices provided between the individual color filters to partition these color filters. In addition, an overcoat is provided over the glass substrate so as to cover these color filters and black matrices, and an ITO conductive film is provided on the overcoat. Achievement of a more precise color display is thus attempted by forming the black matrices to partition the three color filters.

A metallic Cr film has conventionally been used, as described above as the black matrix for color filters for liquid crystal color display. The black matrix of metallic Cr film is widely utilized because of excellent resolution and shading ability.

However, because this metallic Cr is a violent poison having toxicity, there is a risk of exerting an adverse effect on environment or human health. Transfer to other substances is therefore considered, and the general attention is being attracted by resin black matrix which may take the place of Cr black matrix. For the manufacture of such a resin black matrix, there are proposed a wet type process of forming a film by coating a mixed ink of an organic solvent and a pigment, and an electro-deposition process of forming a film with an organic substance dispersed in an electrolyte by the electrophoresis process.

However, the manufacturing method of a resin black matrix based on the wet process or the electro-deposition process is defective in that it is not suitable for mass production because of the complicated manufacturing steps and the low reaction rate.

In the means of any other various color display, as well, utilization of a thin film is expected, but all the conventional techniques center around coating processes, requiring complicated operations and handling. There is also known color display means based on vapor deposition of various metals or inorganic substances, but these techniques involve limitations on color variations, and are therefore poor in degree of freedom as manufacturing methods.

The present invention was developed to solve these drawbacks in the prior art as described above and has an object to provide a novel method of manufacturing a thin film resin matrix which permits easy manufacture of a high-quality thin film for safe and high-performance black matrix taking the place of the Cr-film black matrix and for various color display means.

SUMMARY OF THE INVENTION

As means to solve the above-mentioned problems, the present invention provides a method for producing of a thin film resin matrix which comprises the steps of vaporizing one or more organic pigments and forming a thin film onto a substrate by the plasma exciting deposition The present invention provides also a method for producing a thin film resin matrix, which comprises the steps of vaporizing one or more organic pigments together with a metal or an alloy, and forming a thin film comprising a mixed composite film on the substrate by the plasma exciting deposition

BRIEF DESCRIPTION OF THE DRAWINGS

FIG. 3 shows a reflectance characteristic graph of a metallic Cr film black matrix used for the conventional color filter.

Figure 1:
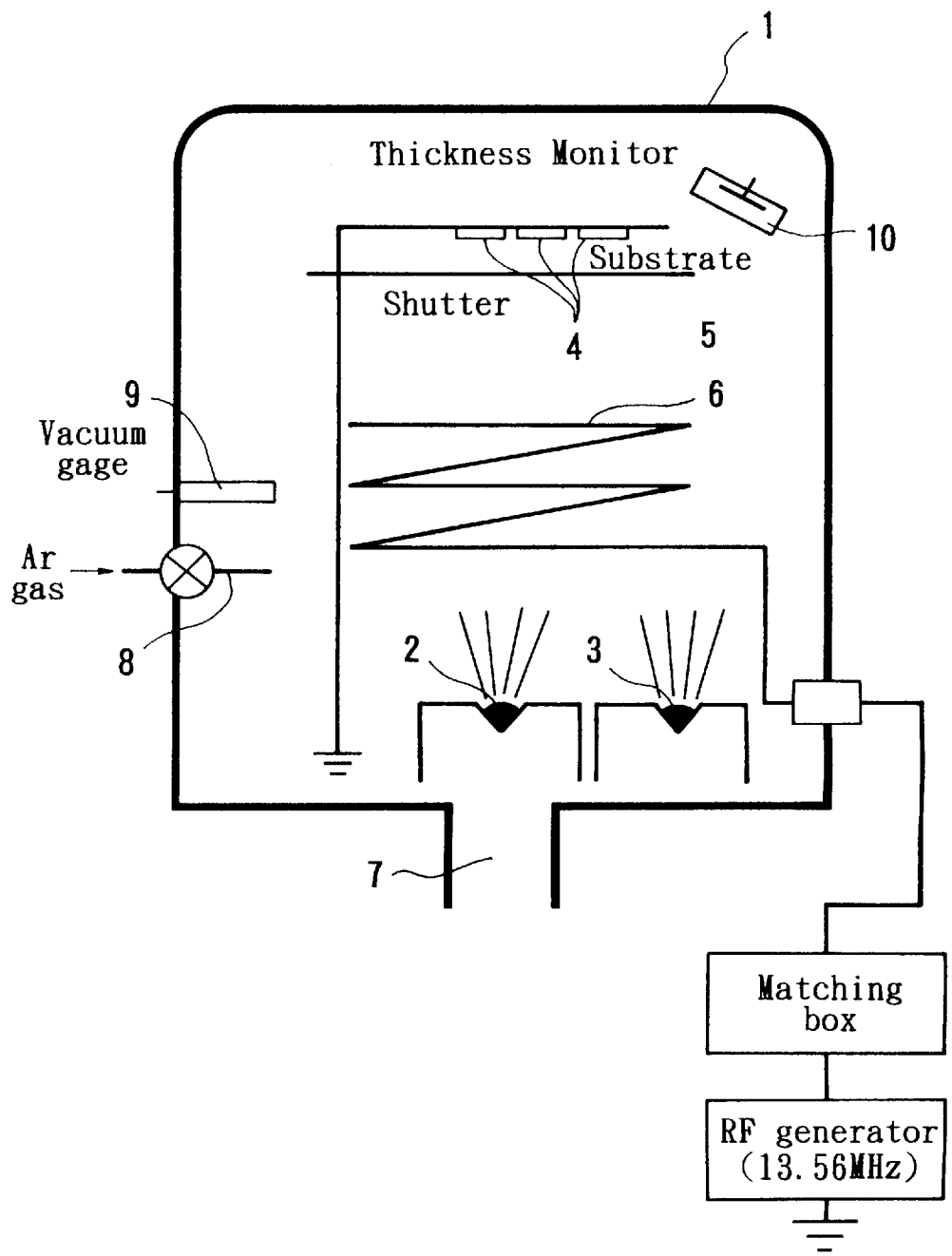
FIG. 1 shows a sectional view illustrating an equipment configuration for the application of the present invention.

In the drawings, the reference numerals represent the following components:
1. Reaction vessel
2. Vaporization source
3. Vaporization source
4. Substrate
5. Shutter
6. High-frequency exciting coil
7. Evacuation port
8. Gas inlet port
9. Vacuum gage
10. Film thickness gauge.

DETAILED DESCRIPTION OF THE INVENTION

In the method for producing a thin film resin matrix of the present invention, as described above, organic pigments are vaporized and deposited by the plasma exciting deposition method on a substrate of glass or the like.

In this method, any of the various methods of forming a thin film by means of glow discharge plasma is adopted as the plasma exciting film forming method. From the point of view of adhesion force of the film and uniformity of the thin film structure, typically applicable plasma exciting film forming methods include ion plating based on high-frequency excitation and reactive ion plating processes.

In this plasma exciting film forming method, organic pigments or organic pigments and a metal or an alloy are vaporized in a reactor vacuum-evacuated to a degree of vacuum within a range of from $1\times10^{-6}$ to $1\times10^{-4}$ Torr and vapor particles are plasma-excited to form a film.

In this plasma exciting film forming, a film may be formed by heating or not heating the substrate under inert gas such as an argon pressure within a range of from $1\times10^{-4}$ to $1\times10^{-2}$ Torr. Vaporization may be generated by resistance heating, induction heating or electron beam irradiation.

In the present invention, a resin black matrix is formed as a mixed composite film comprising one or more substances of organic pigment molecules, crosslinking thereof, plasma polymer thereof and metal or alloy.

As organic pigments, a black pigment such as carbon black, a red pigment, a blue pigment, a green pigment and a yellow pigment is used singly or in the form of a mixture thereof, taking account of the reflectance and film adhesion of the resin matrix to be formed into a film.

Many kind of organic pigments can be used. For example, following organic pigments are mentioned.

Pig, Red 178 (71130)(Perylene Red 178),Pig. Red 189 (71138)(Perylene Red 189), Pig Red 194(71100), Pig. Blue 15(74160) (Phthalocyanine Blue), Pig. Blue 2(44045:2) (Victoria Blue Lake), Pig. Green 7(74260)(Phthalocyaine green), Pig. Green 47(59825)(Violanthrone Green), Pig. Black 1(50440)(Aniline Black), Pig. Yellow 139 (Isoindolinone Y.139), Pig. Yellow 153(Ni Nitroso Yellow), Pig. Yellow 154(Benzimidazolone Y. H3G), etc.

Selection of a blending ratio is made in a similar manner. A metal or an alloy is selected for use from the group consisting of Al, Ti, Ge, Zr, Cd, Zn, Sn, V, Nb, Cu, Cr, W, Mo and Ag.

Applicable materials for the substrate include glass, glass-ITO transparent electrode, various inorganic substances, organic polymers, metals and alloys.

In the present invention, when using an organic pigment alone is used, or when using a composite material of an organic pigment and a metal or an alloy, a plurality of pigment substances may be used. These different organic pigments may be sequentially deposited into a multilayer film, or different organic pigments may be simultaneously vaporized from different vaporization sources for film formation, or different pigments may be vaporized from a previously mixed vaporization source for film formation.

When using a metal or an alloy together with organic pigments, the ratio thereof should be within a range of from about 100:1 to 30 (weight percentage) in the amount used by vaporization.

Upon film formation, it is also effective to apply a bombardment treatment by exposing the substrate surface to plasma.

The thin film resin matrix of the present invention available by the method as described above is excellent in hardness and contact adherence as well as reflectance, and has a very high quality as a matrix capable of taking the place of Cr black matrix and for use of thin films of various color display means.

Now, embodiments of the present invention are described in detail by means of examples. It is needless to mention that the present invention is not limited by the following examples.

EXAMPLES

FIG. 1 illustrates an outline of the equipment configuration for the plasma exciting film formation by high-frequency excitation as the method of the present invention.

For example, as shown in FIG. 1, a reaction vessel (i) has a vaporization sources (2) and (3) housed in a vaporization boat, a substrate (4) supported by a substrate holder, a shutter (5), and a high-frequency coil (6) arranged therein, and evacuation port (7), a gas inlet port (8) of an inert gas such as argon (Ar) and a reactive gas, and a vacuum meter (9) and a film thickness gauge (10).

In the film forming apparatus having the structure as described above, the following operating conditions were adopted:

Degree of vacuum: $1\times10^{-5}$ Torr
Film forming pressure: $1\times10^{-3}$ Torr
High-frequency power: 20 W (13.56 MHz)
Vaporizing means: resistance heating
Distance between substrate and vaporization source: 200 mm
Substrate: glass
Substrate plasma bombardment: Ar, $2\times10^{-4}$ Torr, 10 minutes
Vaporization temperature: 370° C. Film forming rate: 17 to 20 Å/second Under the above-mentioned operating conditions, perylene red (red pigment) and copper phthalocyanine blue (blue pigment) were used as sequential organic pigments as the vaporization sources in FIG. 1, and were sequentially fed every 5,000 Å to form a multilayer film (film thickness: 10,000 Å). The resultant thin film resin matrix had a pencil hardness of HB, showed no peeloff in a stripping test by the scotch tape method. The reflectance was confirmed to be about 2% as a result of measurement at the film surface (Shimazu Seisakusho UV-2100S, reference AI), as shown in FIG. 2.

FIG. 3 illustrates reflectance characteristics of black matrix of a metallic Cr film used in the conventional color filter.

Figure 2:
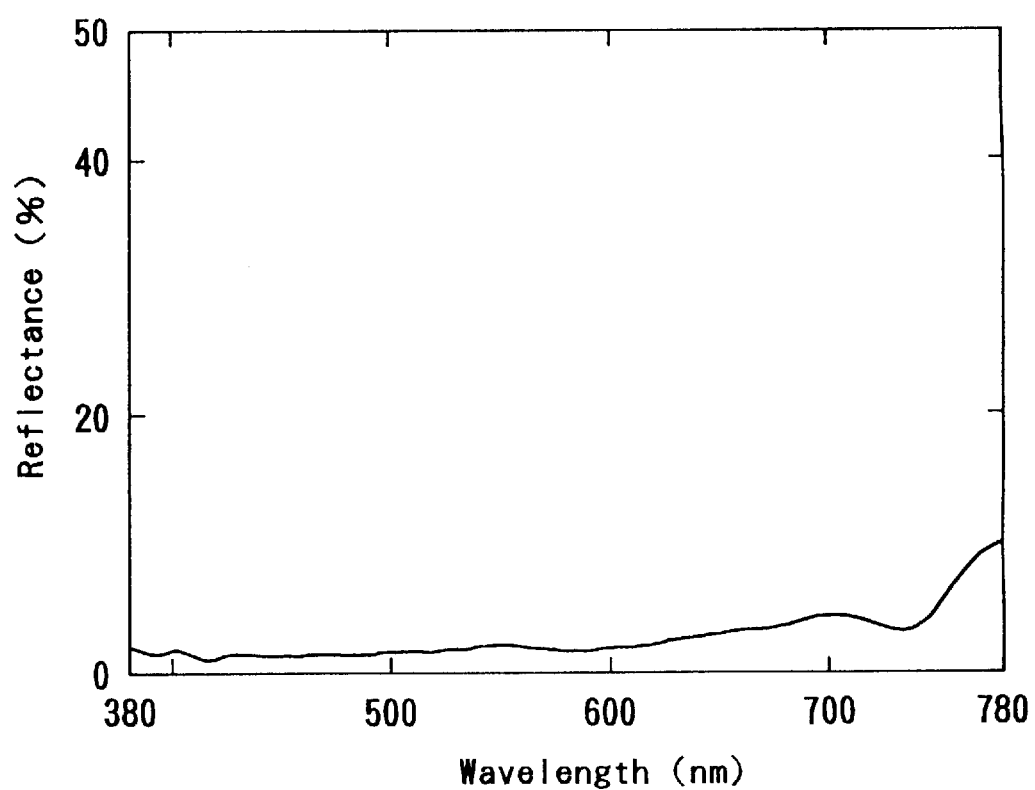
FIG. 2 shows a reflectance characteristic graph of a thin film resin matrix as an embodiment.

As is clear from FIGS. 2 and 3, the resin matrix formed by the method of the present invention, although having a film thickness larger than that of the black matrix of the conventional metallic Cr film, had flat characteristics of a reflectance of about 2% throughout the entire visible radiation region within a wavelength range of from 380 to 700 nm, which is far lower than the high reflectance of the black matrix of the conventional metallic Cr film. Reflectance of the black matrix of the color filter used for liquid crystal display largely effects definition of color display: for example, it is necessary to inhibit reflectance to a low level to increase contrast of display for display under a strong external light. Therefore, the resin matrix of the present invention permits color display of good contrast through a color filter using this matrix because of the excellent low reflectance.

The resin matrix of the present invention has an optical density of up to 3, and therefore, sufficiently satisfies the operating requirement of black matrix that the optical density should be up to 3 throughout the entire visible radiation region of from 380 to 700 nm.

Excellent results similar to those described above were obtained when simultaneously vaporizing the two above-mentioned organic pigments from separate vaporization sources for film forming.

A perylene red-Ge mixed composite film (thickness: 5,000 Å) and a copper phthalocyanine blue-Ge mixed composite film (thickness: 5,300 Å) were formed in the form of multilayer films by using metallic germanium (Ge) as the vaporization source (2) shown in FIG. 1, using perylene red and copper phthalocyanine blue sequentially as the vaporization sources (3), and vaporizing and exciting source (2) and (3) simultaneously.

Figure 4:
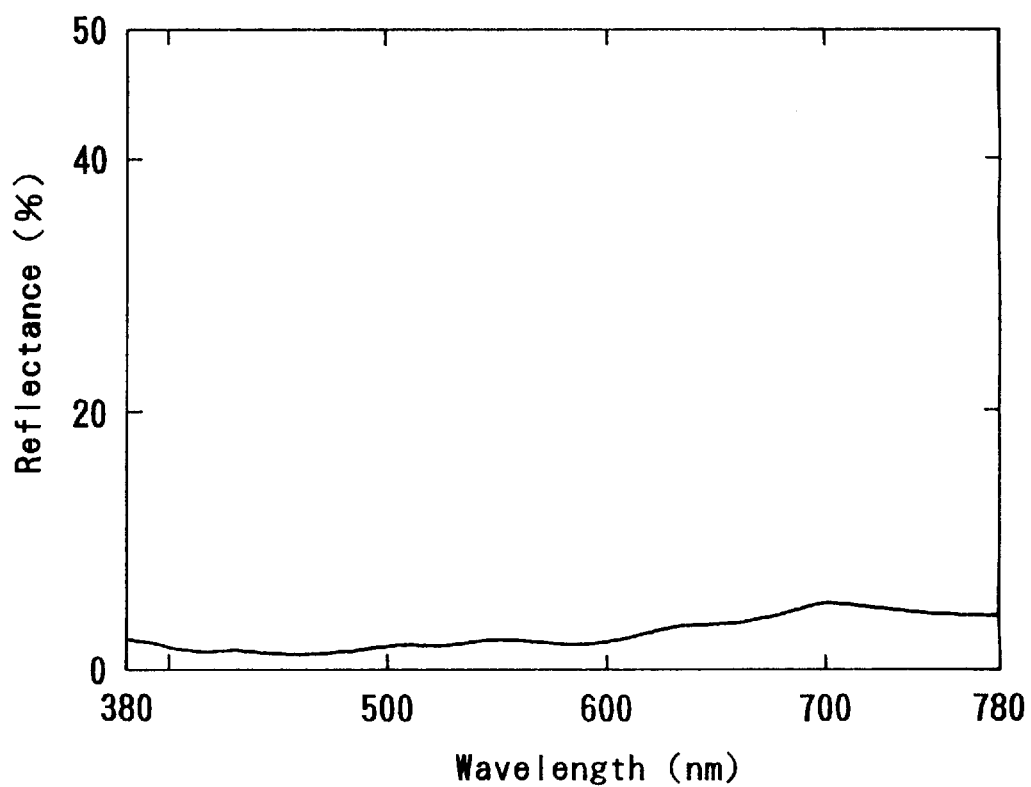
FIG. 4 shows a reflectance characteristic graph of a thin film resin matrix of another embodiment of the present invention.

The resultant resin matrix having a film thickness of 10,300 Å had a pencil hardness of 5H, free from peeloff, and a reflectance of about 2% as shown in FIG. 4. A very hard film of a low reflectance was obtained.

Also in the case where the two above-mentioned organic pigments were vaporized simultaneously from different vaporization sources for film forming, similar excellent results as above were obtained.

According to the present invention, as described above in detail, it is possible to easily manufacture a safe and high-performance resin matrix capable of taking the place of the Cr film black matrix, and to easily manufacture the thin film for use of various high-performance color display means.

What is claimed is:

1. A method forming a thin film resin matrix on a substrate as a black matrix of a color filter formed from organic pigments of different colors, which comprises the steps of vaporizing organic pigments of different colors, which are capable of vaporizing upon heating, onto a substrate, forming a thin film resin matrix on said substrate by plasma exciting deposition using an RF generating source, said thin film resin matrix having an optical density of up to 3 and a reflectance of about 2%, throughout the entire visible radiation region within a wavelength range of 380 to 700 nm.

2. The method for producing a thin film resin matrix as claimed in claim 1, wherein different organic pigments are sequentially formed into a multilayer film.

3. The method for producing a thin film resin matrix as claimed in claim 1, wherein different organic pigments are simultaneously vaporized from different vaporization sources to form a film.

4. The method for producing a thin film resin matrix as claimed in claim 1, wherein different organic pigments are vaporized from a previously mixed vaporization source to form a film.

5. The method for producing a thin film resin matrix as claimed in any one of claims 1 to 4, wherein said organic pigments comprise at least one pigment selected from the group consisting of a red pigment, a blue pigment, a green pigment and a yellow pigment.

6. The method for producing a thin film resin matrix as claimed in claim 1 wherein the organic pigments are selected from the group consisting of Pig. Red 178 (71130) (Perylene Red 178), Pig. Red 189 (71138) (Perylene Red 189), Pig. Red 194 (71100), Pig. Blue 15 (74160) (Phthalocyanine Blue), Pig. Blue 2 (44045:2) (Victoria Blue Lake), Pig. Green 7 (74260) (Phthalocyaine green), Pig. Green 47 (59825) (Violanthrone Green), Pig. Black 1 (50440) (Aniline Black), Pig. Yellow 139 (Isoindolinone Y.139), Pig. Yellow 153 (Ni Nitroso Yellow), and Pig. Yellow 154 (Benzimidazolone Y. H3G) and the metal is selected from the group consisting of Al, Ti, Ge, Zr, Cd, Zn, Sn, V, Nb, Cu, Cr, W, Mo and Ag.

7. The method for producing a thin film resin matrix as claimed in claims 5 or 6 wherein the substrate is selected from the group consisting of glass, an inorganic substance, an organic polymer, a metal and an alloy.

8. The method for producing a thin film resin matrix as claimed in claim 6 wherein the substrate is glass.

9. The method for producing a thin film resin matrix as claimed in claim 6 wherein the substrate is a glass-ITO transparent electrode.

10. The method for producing a thin film resin matrix as claimed in claim 1 wherein the organic pigments are vaporized in a vacuum.

11. The method for producing a thin film resin matrix as claimed in claim 1 wherein the organic pigments are vaporized in the presence of an inert gas.

12. The method for producing a thin film resin matrix as claimed in claim 1 wherein the organic pigment are dyes selected from the group consisting of Pig. Red 178 (71130) (Perylene Red 178), Pig. Red 189 (71138) (Perylene Red 189), Pig. Red 194 (71100), Pig. Blue 15 (74160) (Phthalocyanine Blue), Pig. Blue 2 (44045:2) (Victoria Blue Lake), Pig. Green 7 (74260) (Phthalocyaine green), Pig. Green 47 (59825) (Violanthrone Green), Pig. Black 1 (50440) (Aniline Black), Pig. Yellow 139 (Isoindolinone Y.139), Pig. Yellow 153 (Ni Nitroso Yellow), and Pig. Yellow 154 (Benzimidazolone Y. H3G).

13. A method for producing a thin film resin matrix, as claimed in claim 1, where said substrate is transparent.

14. A method of producing a thin matrix according to claim 1, wherein said organic pigments are at least two pigments of different colors selected from red, blue and green pigments.

* * * * *